(12) United States Patent
Fomenkov et al.

(10) Patent No.: US 8,304,752 B2
(45) Date of Patent: Nov. 6, 2012

(54) EUV LIGHT PRODUCING SYSTEM AND METHOD UTILIZING AN ALIGNMENT LASER

(75) Inventors: Igor V. Fomenkov, San Diego, CA (US); Alexander I. Ershov, Escondido, CA (US); William N. Partlo, Poway, CA (US); Jason Paxton, San Diego, CA (US); Nam-Hyong Kim, San Diego, CA (US); Jerzy R. Hoffman, Montebello, CA (US)

(73) Assignee: Cymer, Inc., San Diego, CA (US)

( * ) Notice: Subject to any disclaimer, the term of this patent is extended or adjusted under 35 U.S.C. 154(b) by 399 days.

(21) Appl. No.: 12/638,413

(22) Filed: Dec. 15, 2009

(65) Prior Publication Data
US 2010/0327192 A1 Dec. 30, 2010

Related U.S. Application Data

(60) Provisional application No. 61/168,332, filed on Apr. 10, 2009.

(51) Int. Cl.
*G01J 1/04* (2006.01)
*G01J 1/18* (2006.01)
(52) U.S. Cl. .............. 250/504 R; 250/492.1; 250/492.2; 250/372; 250/354.1; 369/121
(58) Field of Classification Search .............. 250/504 R, 250/492.1, 492.2; 369/121
See application file for complete search history.

(56) References Cited

U.S. PATENT DOCUMENTS

| | | | |
|---|---|---|---|
| 4,123,143 | A | 10/1978 | Yachin et al. |
| 5,022,033 | A | 6/1991 | Hackell |
| 5,577,092 | A | 11/1996 | Kublak et al. |
| 6,549,551 | B2 | 4/2003 | Ness et al. |
| 6,567,450 | B2 | 5/2003 | Myers et al. |

(Continued)

FOREIGN PATENT DOCUMENTS

JP 2008-103151 1/2008

(Continued)

OTHER PUBLICATIONS

International Search Report issued by the International Searching Authority, Authorized officer Lee W. Young, in corresponding application PCT/US10/30258, mailed Jun. 10, 2010, 2 pages.

(Continued)

*Primary Examiner* — David A Vanore
(74) *Attorney, Agent, or Firm* — DiBerardino McGovern IP Group LLC

(57) ABSTRACT

A method for producing extreme ultraviolet light includes producing a target material at a target location; supplying pump energy to a gain medium of at least one optical amplifier that has an amplification band to produce an amplified light beam; propagating the amplified light beam through the gain medium using one or more optical components of a set of optical components; delivering the amplified light beam to the target location using one or more optical components of the optical component set; producing with a guide laser a guide laser beam that has a wavelength outside of the amplification band of the gain medium and inside the wavelength range of the optical components; and directing the guide laser beam through the optical component set to thereby align one or more optical components of the optical component set.

30 Claims, 8 Drawing Sheets

U.S. PATENT DOCUMENTS

| | | | |
|---|---|---|---|
| 6,625,191 B2 | 9/2003 | Knowles et al. | |
| 6,881,925 B1 | 4/2005 | Sato et al. | |
| 6,972,421 B2 | 12/2005 | Melnychuk et al. | |
| 7,087,914 B2* | 8/2006 | Akins et al. | 250/504 R |
| 7,164,144 B2* | 1/2007 | Partlo et al. | 250/504 R |
| 7,247,870 B2* | 7/2007 | Ershov et al. | 250/504 R |
| 7,439,530 B2* | 10/2008 | Ershov et al. | 250/504 R |
| 7,449,704 B2* | 11/2008 | Fomenkov et al. | 250/504 R |
| 7,453,077 B2* | 11/2008 | Bowering et al. | 250/504 R |
| 7,491,954 B2* | 2/2009 | Bykanov et al. | 250/504 R |
| 7,598,509 B2* | 10/2009 | Ershov et al. | 250/504 R |
| 8,000,212 B2* | 8/2011 | Senekerimyan et al. | 369/121 |
| 2005/0205811 A1* | 9/2005 | Partlo et al. | 250/504 R |
| 2007/0125970 A1* | 6/2007 | Fomenkov et al. | 250/504 R |
| 2007/0158596 A1* | 7/2007 | Oliver et al. | 250/504 R |
| 2007/0158597 A1* | 7/2007 | Fomenkov et al. | 250/504 R |
| 2008/0017801 A1* | 1/2008 | Fomenkov et al. | 250/354.1 |
| 2008/0197297 A1* | 8/2008 | Akins et al. | 250/504 R |
| 2008/0283776 A1* | 11/2008 | Algots et al. | 250/492.1 |
| 2009/0052488 A1 | 2/2009 | Sugiyama et al. | |
| 2009/0067468 A1 | 3/2009 | Brown et al. | |
| 2009/0230326 A1* | 9/2009 | Vaschenko et al. | 250/492.2 |
| 2010/0127191 A1* | 5/2010 | Partlo et al. | 250/504 R |
| 2010/0258749 A1* | 10/2010 | Partlo et al. | 250/504 R |
| 2010/0258750 A1* | 10/2010 | Partlo et al. | 250/504 R |
| 2010/0294953 A1* | 11/2010 | Vaschenko et al. | 250/492.1 |
| 2011/0140008 A1* | 6/2011 | Bergstedt et al. | 250/504 R |
| 2011/0141865 A1* | 6/2011 | Senekerimyan et al. | 369/47.15 |
| 2011/0233429 A1* | 9/2011 | Vaschenko | 250/492.1 |
| 2011/0240890 A1* | 10/2011 | Govindaraju et al. | 250/504 R |
| 2011/0248191 A1* | 10/2011 | Fomenkov et al. | 250/504 R |

FOREIGN PATENT DOCUMENTS

| | | |
|---|---|---|
| JP | 2008-042048 | 2/2008 |

OTHER PUBLICATIONS

Written Opinion issued by the International Searching Authority, Authorized officer Lee W. Young, in corresponding application PCT/US10/30258, mailed Jun. 10, 2010, 6 pages.

Office Action in Japanese patent application No. 2000-062679, issued Nov. 17, 2008 (2 pages) by Japanese Patent Office, pending claims (2 pages), and English abstract cited reference JP4305389 (1 page).

"High-power tunable external cavity quantum cascade laser in the 5-11 micron regime," Michael Pushkarsky, et al., presented at Photonics West 2008, Jan. 19, 2008, San Jose, California, USA (8 pages).

U.S. Appl. No. 61/200,222, filed Nov. 24, 2008.
U.S. Appl. No. 12/592,107, filed Nov. 18, 2009.
U.S. Appl. No. 61/168,033, filed Apr. 9, 2009.

* cited by examiner

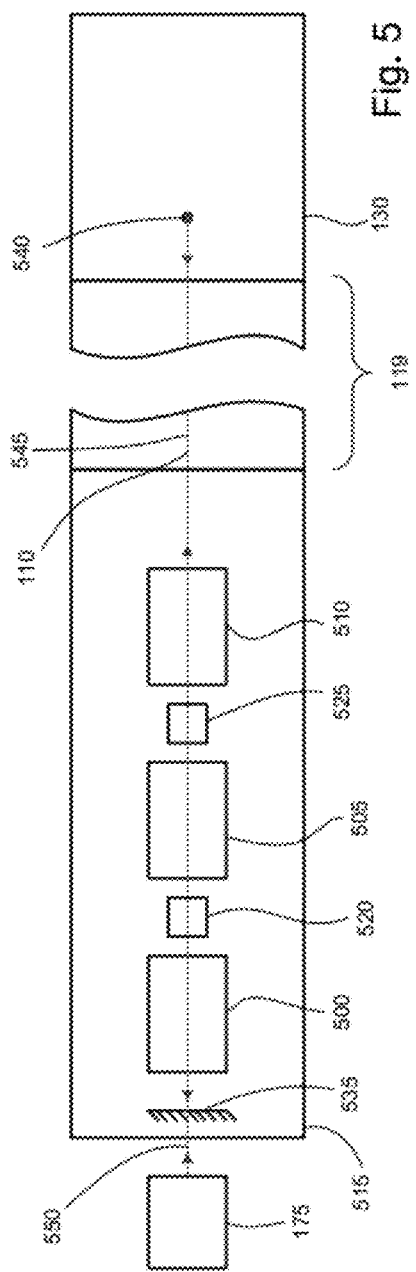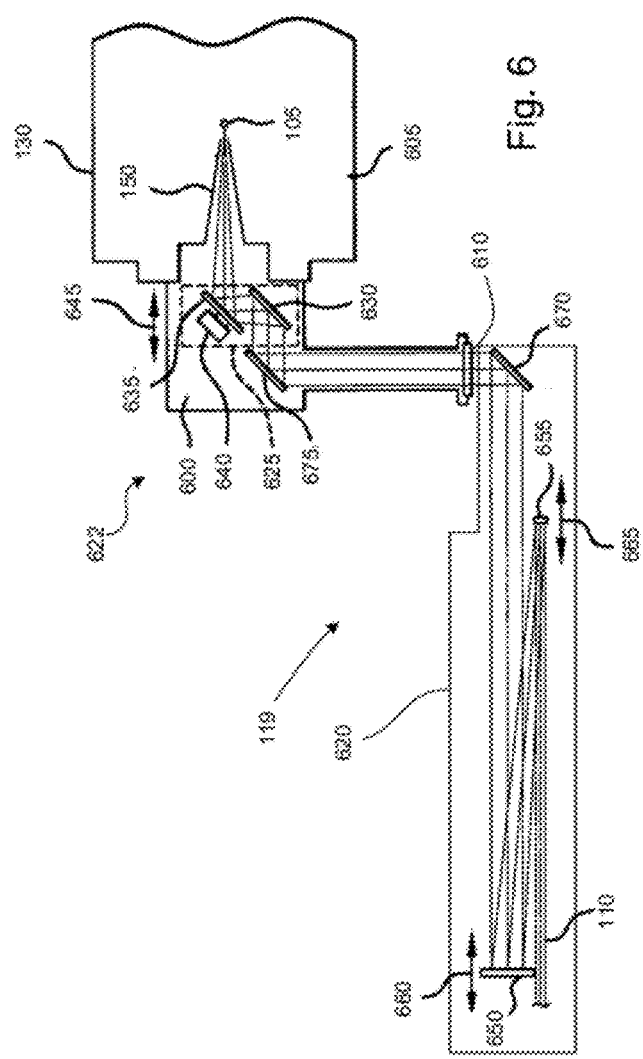

EUV LIGHT PRODUCING SYSTEM AND METHOD UTILIZING AN ALIGNMENT LASER

CROSS REFERENCE TO RELATED APPLICATION

This application claims the benefit of U.S. Provisional Application No. 61/168,332, filed Apr. 10, 2009, which is incorporated herein by reference in its entirety.

TECHNICAL FIELD

The disclosed subject matter relates to an alignment laser used to align optical components of a high power laser system.

BACKGROUND

Extreme ultraviolet ("EUV") light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers.

Methods to produce EUV light include, but are not necessarily limited to, converting a material into a plasma state that has an element, for example, xenon, lithium, or tin, with an emission line in the EUV range. In one such method, often termed laser produced plasma ("LPP"), the required plasma can be produced by irradiating a target material, for example, in the form of a droplet, stream, or cluster of material, with an amplified light beam that can be referred to as a drive laser. For this process, the plasma is typically produced in a sealed vessel, for example, a vacuum chamber, and monitored using various types of metrology equipment.

$CO_2$ lasers, which output light at a wavelength of about 10600 nm, can present certain advantages as a drive laser irradiating the target material in an LPP process. This may be especially true for certain target materials, for example, for materials containing tin. For example, one advantage is the ability to produce a relatively high conversion efficiency between the drive laser input power and the output EUV power. Another advantage of $CO_2$ drive lasers is the ability of the relatively long wavelength light (for example, as compared to deep UV at 193 nm) to reflect from relatively rough surfaces such as a reflective optic that has been coated with tin debris. This property of 10600 nm radiation can allow reflective mirrors to be employed near the plasma for, for example, steering, focusing and/or adjusting the focal power of the drive laser beam.

SUMMARY

In one general aspect, a method includes supplying pump energy to a gain medium of at least one optical amplifier of a gas laser system to cause a population inversion in the gain medium and to produce an amplified light beam, directing a guide laser beam from a guide laser having a guide wavelength toward optical components, and aligning the optical components using the directed guide laser beam. The at least one optical amplifier operates at an operating wavelength. Each optical component is associated with a range of wavelengths. The guide wavelength is distinct from the operating wavelength and is within the wavelength range of the optical components.

Implementations can include one or more of the following features. For example, each optical component can have a wavelength range that encompasses the operating wavelength of the at least one optical amplifier.

The guide wavelength can be distinct from the operating wavelength such that the guide laser beam does not contribute substantially to the gain of the gas laser system.

The one or more of the optical components can be within the gas laser system. The guide laser beam can be directed toward the optical components by directing the guide laser beam through the gas laser system. The method can also include arranging an optical reflector at a back side of the gas laser system such that the amplified light beam that exits the gas laser system is reflected off the optical reflector back into the gas laser system through the back side. The guide laser beam can be directed toward the optical components by directing the guide laser beam through the optical reflector.

The method can also include amplifying the amplified light beam to a point at which it becomes an operating laser beam. The method can also include directing the operating laser beam toward a target location. One or more of the optical components can be between the gas laser system and the target location. The method can include aligning the operating laser beam onto the target location using the guide laser beam. The operating laser beam can be aligned by directing the guide laser beam toward the target location through the one or more optical components. The method can also include supplying a target material at the target location for a target time period. In this case, the guide laser beam can be directed toward the target location by directing the guide laser beam toward the target location for a time outside of the target time period. The method can include supplying a target material at the target location. In this case, the operating laser beam can be directed toward the target location to cause production of plasma at the target material.

The target material can include tin. The target material can be a droplet.

The optical components can be aligned using the amplified light beam by aligning the optical components during initial set up of the gas laser system.

The optical components can be aligned using the amplified light beam by aligning the optical components during laser operation of the gas laser system.

The guide wavelength can be within about 100 nm of the operating wavelength of the at least one optical amplifier.

In another general aspect, a system for aligning optical components includes a gas laser system having one or more optical amplifiers that each operate at an operating wavelength and each include a gain medium that, when in a pumped state, produces an amplified light beam; optical components, each associated with a range of wavelengths; and a guide laser that produces a guide laser beam having a guide wavelength. The guide laser is positioned such that the guide laser beam is directed toward the optical components while a gain medium of the one or more optical amplifiers of the gas laser system is in a pumped state. The guide wavelength is distinct from the operating wavelength and is within the wavelength range of the optical components.

Implementations can include one or more of the following features. For example, wavelength range of each of the optical components can encompass the operating wavelength of the gas laser system. The guide wavelength can be distinct from the operating wavelength such that the guide laser beam does not contribute substantially to gain of the gas laser system.

The gas laser system can lack a master oscillator. The gas laser system can include three optical amplifiers arranged in series with each other.

The one or more optical amplifiers of the gas laser system can include $CO_2$ as the gain media.

The gas laser system can operate at a wavelength of about 10600 nm.

The optical components can include a curved mirror that is external to the one or more optical amplifiers. The curved mirror can be a parabolic mirror. The optical components can include one or more mirrors.

The system can include an output coupler at a front side of the gas laser system; and an optical reflector at a back side of the gas laser system that is distinct from the front side. The optical reflector can be positioned so that an amplified light beam that exits the gas laser system is reflected from a front face of the optical reflector and is directed back into the gas laser system through the back side. The guide laser beam can be directed through a back face of the optical reflector toward the optical components.

The gas laser system can operate at powers of greater than about 10 kW.

The guide laser beam can be directed toward the optical components after the gas laser system has enough gain to convert the amplified light beam into an operating laser beam.

The optical components can be within one or more of the optical amplifiers. The optical components can be external to the one or more optical amplifiers.

The one or more optical amplifiers can be arranged in series and can include cavity forming mirrors, one of the cavity forming mirrors including a highly reflecting mirror and the other of the cavity forming mirrors including an output coupler.

The guide laser can include an isotopic $CO_2$ gas laser. The isotopic $CO_2$ gas laser can operate at an operating wavelength of about 11000 nm.

The guide laser can include a quantum cascade laser operating at a wavelength of about 8100 nm.

In another general aspect, a laser produced plasma system for producing extreme ultraviolet light includes a target material delivery system that produces a target material at a target location; at least one optical amplifier containing a gain medium that defines an amplification band; a set of optical components configured and arranged to propagate an amplified light beam produced in the gain medium through the gain medium and to deliver the amplified light beam to the target location; and a guide laser that produces a guide laser beam that has a wavelength outside of the amplification band of the gain medium and inside the wavelength range of the optical components. The guide laser beam is directed through the optical component set.

Implementations can include one or more of the following features. For example, the optical component set can include mirrors.

The at least one optical amplifier can have enough gain to convert the amplified light beam into an operating laser beam when the target material is at the target location.

The optical component set can include a focus assembly between the at least one optical amplifier and the target location. The focus assembly can be configured and arranged to focus the amplified light beam onto the target location. The guide laser beam can be directed through the optical component set to steer the amplified light beam to the target location. The focus assembly can include one or more lenses and one or more mirrors. The focus assembly can include a curved mirror. The curved mirror can have a reflective surface that is shaped like a parabola. The focus assembly can include a lens. The lens can be made of ZnSe.

The laser system can include a metrology system including an optical element that is placed to sample one or more of a portion of guide laser beam and a portion of the amplified light beam to analyze a quality of the sampled portion and provide feedback for adjusting positioning and divergence of the amplified light beam.

The at least one optical amplifier can produce a gas laser beam that is directed to the target location.

The guide laser beam can be directed through the optical component set while the gas laser system has enough gain to convert the amplified light beam into an operating laser beam that is directed toward the target location.

The gain medium of the at least one optical amplifier can include a $CO_2$ gain medium.

The at least one optical amplifier can lack a master optical amplifier.

The at least one optical amplifier can be designed as an axial flow system.

The laser system can include a metrology system that analyzes sampled light of the guide laser and uses this information to adjust the focus assembly.

In another general aspect, a method for producing extreme ultraviolet light includes producing a target material at a target location; supplying pump energy to a gain medium of at least one optical amplifier that has an amplification band to produce an amplified light beam; propagating the amplified light beam through the gain medium using one or more optical components of a set of optical components; delivering the amplified light beam to the target location using one or more optical components of the optical component set; producing with a guide laser a guide laser beam that has a wavelength outside of the amplification band of the gain medium and inside the wavelength range of the optical components; and directing the guide laser beam through the optical component set to thereby align one or more optical components of the optical component set.

Implementations can include one or more of the following features. For example, the amplified light beam can be delivered to the target location by directing the amplified light beam through a focus assembly between the at least one optical amplifier and the target location. The focus assembly is configured and arranged to focus the amplified light beam onto the target location. The guide laser beam can be directed by aligning the amplified light beam on the target location.

DRAWING DESCRIPTION

FIG. 5 is a diagram of an implementation of a laser system, a guide laser, a beam delivery system, and a target chamber of the light source of FIG. 1;

FIG. 6 is a diagram of a portion of a laser system, a beam delivery system, and a target chamber that can be used in the light source of FIG. 1;

DESCRIPTION

Figure 1:
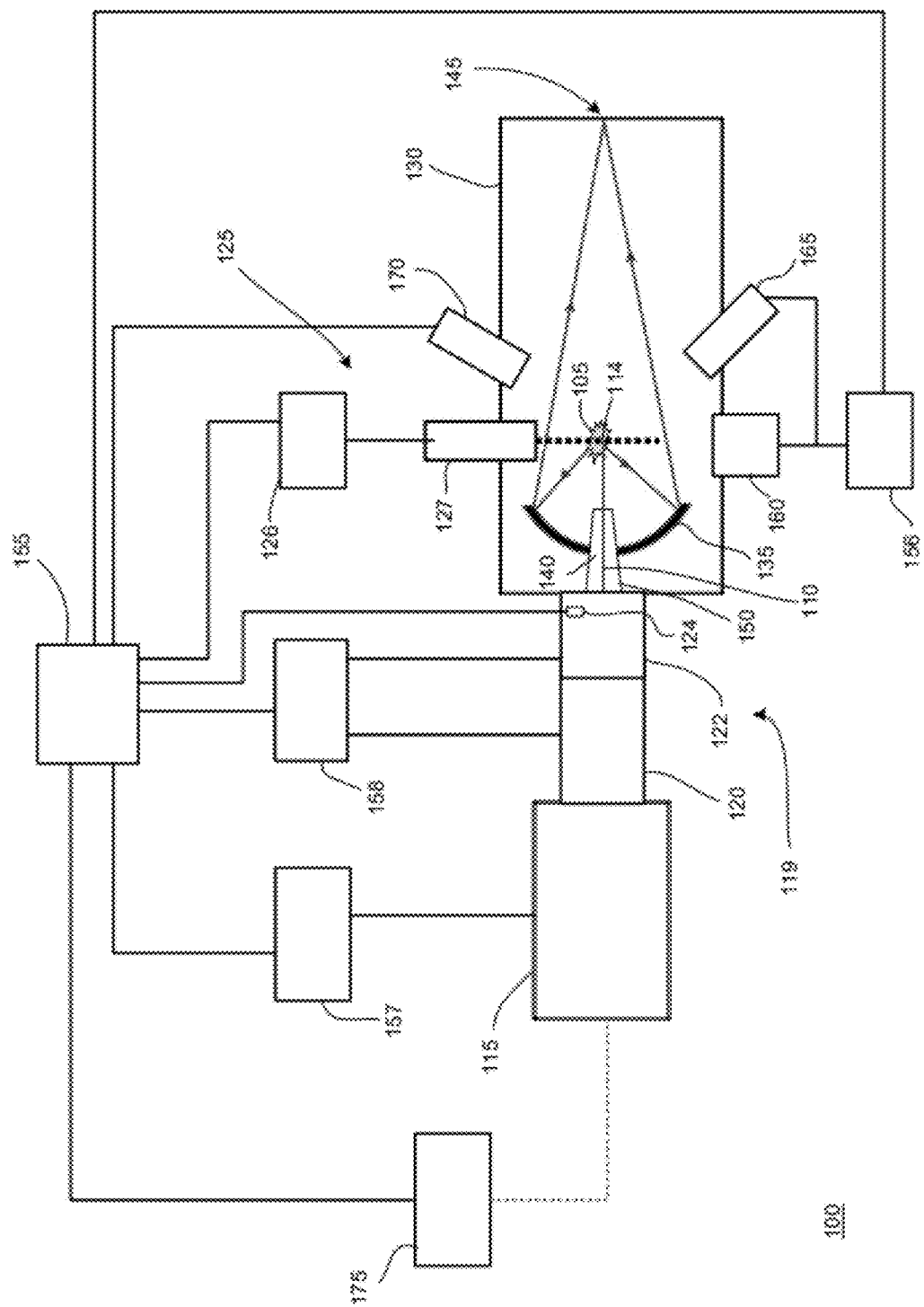
FIG. 1 is a block diagram of a light source that includes a guide laser.

Referring to FIG. 1, an LPP EUV light source 100 is formed by irradiating a target material 114 at a target location 105 within a vacuum chamber 130 with an amplified light beam 110 to convert the target material 114 into a plasma state that has an element with an emission line in the EUV range. The light source 100 includes a laser system 115 that produces the amplified light beam due to a population inversion within the gain medium of the laser system 115.

Suitable laser amplifiers that can be used in the laser system 115 shown in FIG. 1 can include, but are not necessarily limited to, a pulsed laser device, for example, a pulsed gas discharge $CO_2$ laser device producing radiation at 9.3 μm or 10.6 μm, for example, with DC or RF excitation, operating at a relatively high power, for example, at 10 kW or higher and a high pulse repetition rate, for example, at 40 kHz or more.

The light source 100 also includes a beam delivery system 119 between the laser system 115 and the target location 105, the beam delivery system 119 including a beam transport system 120 and a focus assembly 122. The beam transport system 120 receives the amplified light beam 110 from the laser system 115, and steers and modifies the amplified light beam 110 as needed and outputs the amplified light beam 110 to the focus assembly 122. The focus assembly 122 receives the amplified light beam 110 and focuses the beam 110 to the target location 105.

In some implementations, the laser system 115 can be configured with one or more laser amplifiers, which each laser amplifier including a gain medium, an excitation source, and internal optics. The laser amplifier may or may not have laser mirrors or other feedback devices that form a laser cavity. Thus, the laser system 115 produces an amplified light beam 110 due to the population inversion in the gain media of the laser amplifiers even if there is no laser cavity. Moreover, the laser system 115 can produce an amplified light beam 110 that is a coherent laser beam if there is a laser cavity to provide enough feedback to the laser system 115. The term "amplified light beam" encompasses one or more of: light from the laser system 115 that is merely amplified but not necessarily a coherent laser oscillation and light from the laser system 115 that is not only amplified but also is a coherent laser oscillation.

In the implementation described in FIG. 5, as will be described in greater detail below, a laser cavity can be formed by adding a rear partially reflecting optic (labeled as 535 in FIG. 5) to the laser system 115 and placing a target material (labeled as 540 in FIG. 5) at the target location 105. The target material 540 and the rear partially reflecting optic 535 act to reflect some of the amplified light beam 110 back into the laser system 115 to form the laser cavity. Thus, the presence of the target material 540 at the target location 105 provides enough feedback to cause the laser system 115 to produce coherent laser oscillation and in this case, the amplified light beam 110 can be considered a laser beam. When the target material 540 isn't present at the target location 105, the laser system 115 may still be pumped to produce the amplified light beam 110 but it would not produce a coherent laser oscillation.

The light source 100 includes a target material delivery system 125, for example, delivering target material in the form of liquid droplets, a liquid stream, solid particles or clusters, solid particles contained within liquid droplets or solid particles contained within a liquid stream. The target material can include, for example, water, tin, lithium, xenon, or any material that, when converted to a plasma state, has an emission line in the EUV range. For example, the element tin can be used as pure tin (Sn), as a tin compound, for example, $SnBr_4$, $SnBr_2$, $SnH_4$, as a tin alloy, for example, tin-gallium alloys, tin-indium alloys, tin-indium-gallium alloys, or any combination of these alloys. The target material can include a wire coated with one of the above elements, such as tin. If the target material is in a solid state, it can have any suitable shape, such as a ring, a sphere, or a cube. The target material can be delivered by the target material delivery system 125, for example, into the interior of a chamber 130 to the target location 105, which is also referred to as an irradiation site, where the target material is irradiated by the amplified light beam 110 to produce plasma.

At the irradiation site, the amplified light beam 110, suitably focused by the focus assembly 122, is used to create plasma having certain characteristics that depend on the composition of the target material. These characteristics can include the wavelength of the EUV light produced by the plasma and the type and amount of debris released from the plasma.

The light source 100 includes a collector mirror 135 having an aperture 140 to allow the amplified light beam 110 to pass through and reach the target location 105. The collector mirror 135 can be, for example, an ellipsoidal mirror that has a first focus at the target location 105 and a second focus at an intermediate location 145 (also called an intermediate focus) where the EUV light can be output from the light source 100 and can be input to, for example, an integrated circuit lithography tool (not shown). The light source 100 can also include an open-ended, hollow conical shroud 150 (for example, a gas cone) that tapers toward the target location 105 from the collector mirror 135 to reduce the amount of plasma generated debris that enters the beam delivery system 119 while allowing the amplified light beam 110 to reach the target location 105. For this purpose, a gas flow can be provided in the shroud that is directed toward the target location 105.

The light source 100 can also include a master controller 155 that is connected to a droplet position detection feedback system 156, a laser control system 157, and a beam control system 158. The light source 100 can include one or more target or droplet imagers 160 that provide an output indicative of the position of a droplet, for example, relative to the target location 105 and provide this output to the droplet position detection feedback system 156, which can, for example, compute a droplet position and trajectory from which a droplet position error can be computed either on a droplet by droplet basis or on average. The droplet position detection feedback system 156 thus provides the droplet position error as an input to the master controller 155. The master controller 155 can therefore provide a laser position, direction, and timing correction signal, for example, to the beam control system 158 that can be used, for example, to control the laser timing circuit and/or to control an amplified light beam position and shaping of the beam delivery system 119 to change the location and/or focal power of the beam focal spot within the chamber 130.

The target material delivery system 125 includes a target material delivery control system 126 that is operable in response to a signal from the master controller 155 to, for example, modify the release point of the droplets as released by a delivery mechanism 127 to correct for errors in the droplets arriving at the desired target location 105.

Additionally, the light source 100 can include a light source detector 165 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 165 generates a feedback signal for use by the master controller 155. The feedback signal can be, for example, indicative of the errors in parameters such as the timing and focus of the laser pulses to properly intercept the droplets in the right place and time for effective and efficient EUV light production.

The light source 100 also includes a guide laser 175 that can be used to align various sections of the light source 100 or to assist in steering the amplified light beam 110 to the target location 105. In connection with the guide laser 175, the light source 100 includes a metrology system 124 that is placed within the focus assembly 122 to sample a portion of light from the guide laser 175 and the amplified light beam 110. In other implementations, the metrology system 124 is placed within the beam transport system 120.

The metrology system 124 can include an optical element that samples or re-directs a subset of the light, such optical element being made out of any material that can withstand the powers of the guide laser beam and the amplified light beam 110. For example, the sample optical element within the metrology system 124 can include a substrate made of zinc selenide (ZnSe) that is coated with an anti-reflection coating. The sample optical element within the metrology system 124 can be a diffraction grating positioned at an angle relative to the longitudinal direction of the amplified light beam 110 to decouple some light from the amplified light beam 110 and from the guide laser 175 for diagnostic purposes. Because the wavelengths of the amplified light beam 110 and beam of the guide laser 175 are distinct from each other, they can be directed away from the diffraction grating at separate angles to enable separation of the beams. In other implementations, the sample optical element is a partially reflecting mirror that directs a portion of the beam of the guide laser 175 and the light beam 110 into a diffraction grating located outside the direct path of the amplified light beam 110.

A beam analysis system is formed from the metrology system 124 and the master controller 155 since the master controller 155 analyzes the sampled light from the guide laser 175 and uses this information to adjust components within the focus assembly 122 through the beam control system 158. In other implementations, the metrology system 124 includes one or more dichroic mirrors placed within the focus assembly 122 to separate the amplified light beam 110 from the guide laser 175 and to provide for separate analyses. Such a metrology system is described in U.S. application Ser. No. 12/637,961, entitled "Metrology for Extreme Ultraviolet Light Source", filed on Dec. 15, 2009, and assigned docket number 002-017001/2009-0027-01, which is incorporated herein by reference in its entirety.

Thus, in summary, the light source 100 produces an amplified light beam 110 that is directed at the target material at the target location 105 to convert the target material into plasma that emits light in the EUV range. The amplified light beam 110 operates at a particular wavelength that is determined based on the design and properties of the laser system 115, as will be discussed in more detail below. Additionally, the amplified light beam 110 can be a laser beam when the target material provides enough feedback back into the laser system 115 to produce coherent laser light.

The laser system 115 includes one or more optical amplifiers and several optical components (for example, about 20 to 50 mirrors) and the beam delivery system 119 (including the beam transport system 120 and the focus assembly 122) includes several optical components such as, for example, mirrors, lenses, and prisms. All of these optical components have a wavelength range that encompasses the wavelength of the amplified light beam 110 to permit efficient formation of the amplified light beam 110 and output of the amplified light beam 110 to the target location 105. Additionally, one or more of the optical components can be formed with a multilayer dielectric anti-reflective interference coating on a substrate. Because of the number of optical components in the laser system 115 and the beam delivery system 119, it can be difficult to use a guide laser to align one or more parts of the laser system 115 and the beam delivery system 119 if the guide laser lacks sufficient power and/or has an operating wavelength that is too far removed from the range of operating wavelengths of the optical components in the laser system 115 and the beam delivery system 119 or if it is too far from the wavelength of the amplified light beam 110 of the laser system 115. Additionally, it is preferable to select a wavelength for the guide laser that is within the wavelength range of the optical components in the laser system 115 and the beam delivery system 119 to ensure that losses at the optical components in the guide laser beam are similar to the losses suffered by the amplified light beam 110 at the optical components.

For example, a Helium-Neon laser would not be practical to use to align the parts of the laser system 115 and the beam delivery system 119 because it does not have enough power (it operates at a few milliwatts) and its operating wavelength (632.8 nm) is outside of the range of wavelengths of the optical components in the laser system 115 and the beam delivery system 119 so that the Helium-Neon laser does not propagate in the same way as the amplified light beam 110.

Figure 2:
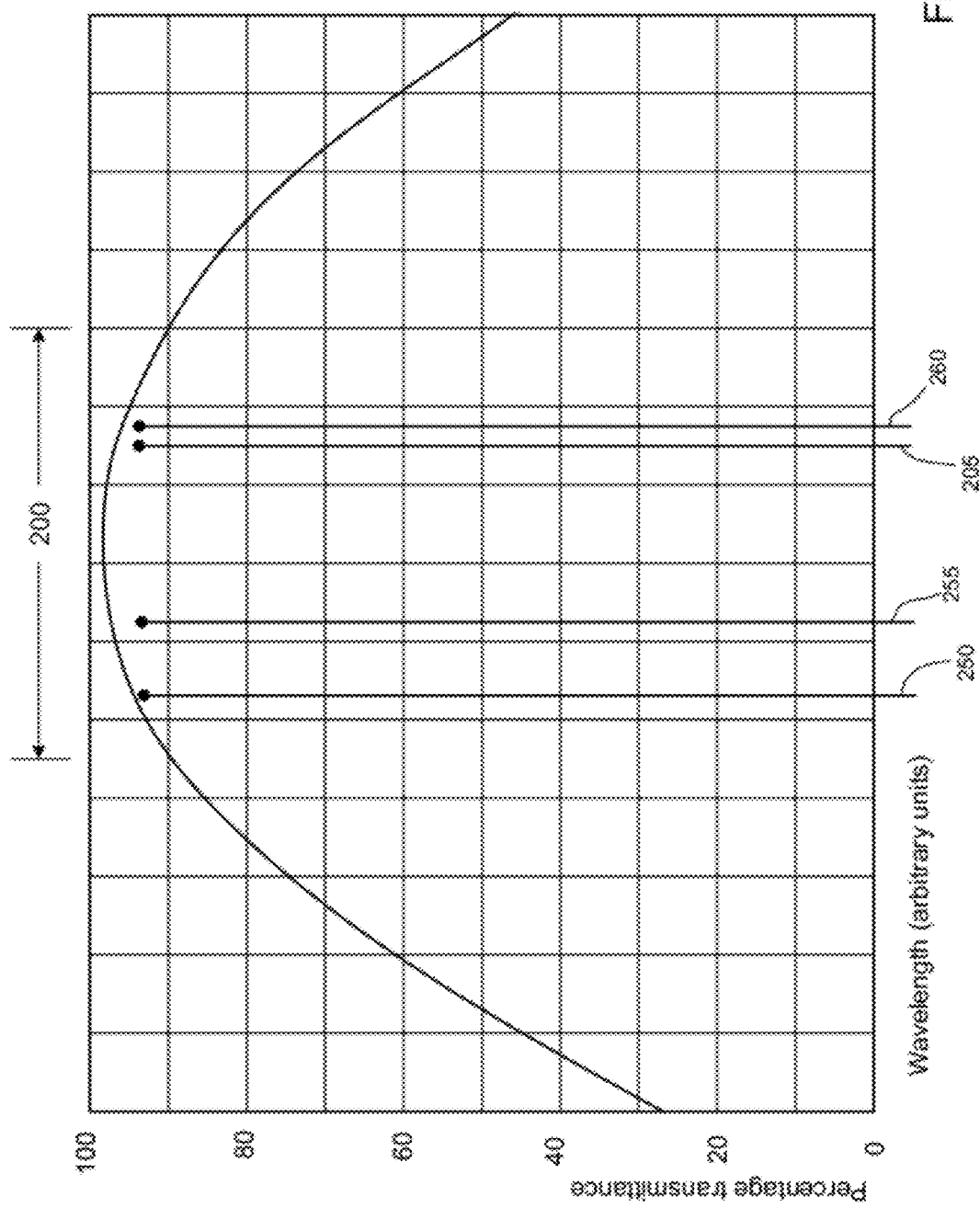
FIG. 2 is a graph of transmittance versus wavelength for an optical component that can be used in the light source of FIG. 1.

In particular, the range of wavelengths of the optical components in the laser system 115 and the beam delivery system 119 encompasses the operating wavelength of the amplified light beam 110. Thus, if the amplified light beam 110 is produced from one or more $CO_2$ optical amplifiers then the amplified light beam 110 can have a wavelength of about 10600 nm. As an example, FIG. 2 shows a graph of the percentage of transmittance of a sample transmissive optical component that can be found in the laser system 115 or in the beam delivery system 119. In this case, the optical component is designed to generally transmit the amplified light beam 110 along a path and therefore, the higher the transmittance at a particular wavelength, the more efficient the optical component is at conveying the amplified light beam at that wavelength. For example, the transmissive optical component has a range 200 of wavelengths at which transmittance through the optical component is greater than 90% and this range 200 encompasses an operating wavelength 205 of the laser system 115. The optical component could be, for example, a partially transmissive mirror, a focusing element such as a lens or curved mirror, a beam splitter. In other implementations, the wavelength range 200 can be determined to be those wavelengths at which transmittance is, for example, greater than 80%, 95%, or 98%.

Figure 3:
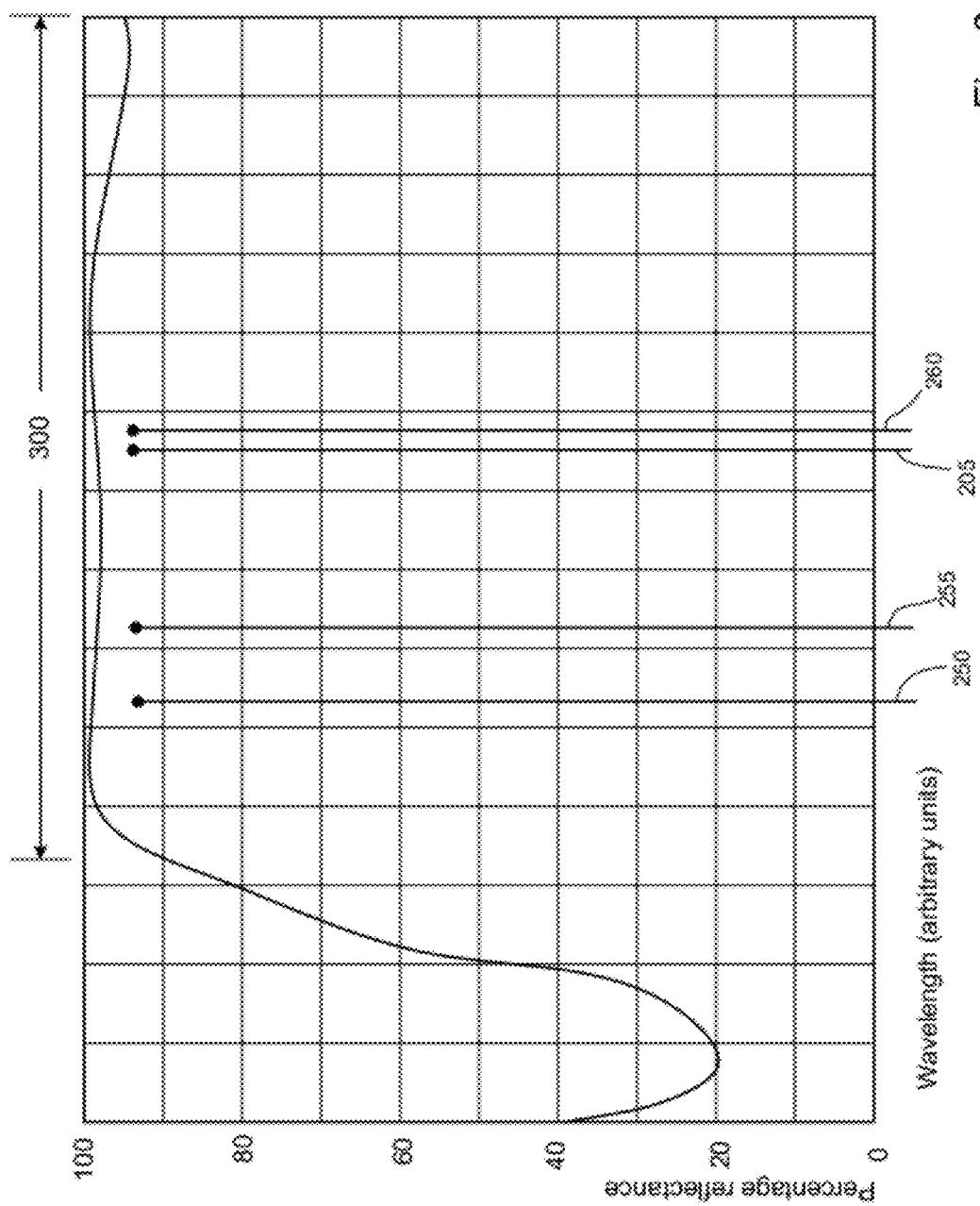
FIG. 3 is a graph of reflectance versus wavelength for an optical component that can be used in the light source of FIG. 1.

As another example, FIG. 3 shows a graph of the percentage of reflectance of a sample reflective optical component that can be used in the laser system 115 or in the beam delivery system 119. In this case, the optical component is designed to reflect the amplified light beam 110 and therefore, the higher the reflectance at a particular wavelength, the more efficient the optical component is at reflecting the amplified light beam at that wavelength. For example, the reflective optical component has a range 300 of wavelengths at which the reflectance is greater than 90% and this range 300 encompasses the operating wavelength 205 of the laser system 115.

In other implementations, the wavelength range 300 can be determined to be those wavelengths at which reflectance is, for example, greater than 80%, 95%, or 98%.

Figure 4:
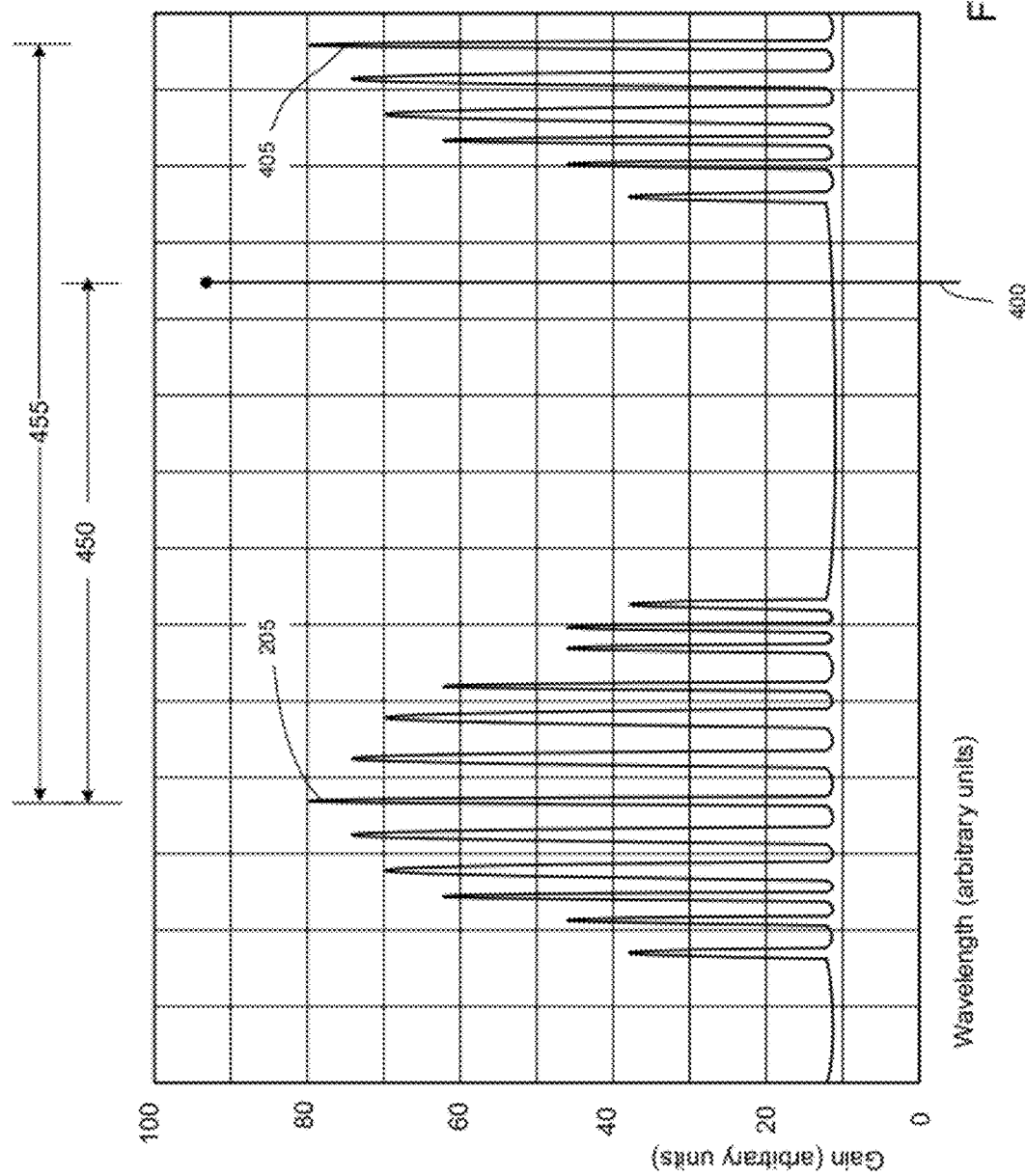
FIG. 4 is a graph of gain versus wavelength for a laser system that can be used in the light source of FIG. 1.

Another factor in selecting a guide laser to align the laser system 115 and/or to steer the amplified light beam 110 toward the target location 105 is that guide laser should be non-actinic. Referring to FIG. 4, a generalized gain profile for a laser system 115 shows that the laser system 115 has distinct gain peaks at which the laser system 115 operates. The laser system 115 is configured to produce the amplified light beam 110 at one of these peaks, and this can be referred to as the operating wavelength 205. The guide laser operates at a guide wavelength (such as, for example, wavelength 400 or 405). The guide laser is non-actinic if the guide wavelength (for example, wavelength 400 or 405) of the laser beam output from the guide laser is distinct from (that is, does not exactly match) the operating wavelength 205 of the laser system 115. In this way, the guide laser beam does not contribute substantially to the gain of the laser system 115, that is, the guide laser beam is outside of the amplification band of the laser gain media within the optical amplifiers of the laser system 115. Moreover, it is technically more practical to separate the guide laser beam from the amplified light beam 110 for diagnostic purposes if the guide wavelength (for example, 400 or 405) is distinct from the operating wavelength 205. For example, the amplified light beam 110 can change its intensity by many orders of magnitude, for example, from about zero, when the gain medium inside the laser system 115 is not inverted, to, for example, about 1000 to 1,000,000 times the power of the guide laser 175 when the gain medium inside the laser system 115 is inverted. It can be very difficult to handle such a large change in power if the two beams are not spatially separated when they reach a beam analysis module. Thus, it can be beneficial to use a guide wavelength that is distinct from the operating wavelength 205. If the guide wavelength is closer to but does not match the operating wavelength 205, then it still may be possible to distinguish the guide laser beam from the amplified light beam 110 for diagnostic purposes using optical devices that separate the two beams, such as, for example, a diffraction grating. For example, the guide wavelength can be within a range (for example, 1 nm, 10 nm, or 100 nm) of the operating wavelength. Thus, in the example of FIG. 4, the guide wavelength 400 is within the range 450 of the operating wavelength 205 and the guide wavelength 405 is within the range 455 of the operating wavelength 205. The values and the graph shown in FIG. 4 are merely schematic representations and do not reflect the scale of the ranges, and are provided purely for illustrative purposes to describe how the guide wavelength can be selected based on the design of the components of the light source 100.

Referring again to FIGS. 2 and 3, exemplary guide wavelengths 250, 255, and 260 are shown in relation to the operating wavelength 205 and the wavelength range of the optical components. It should be noted that these exemplary guide wavelengths 250, 255, and 260 are merely shown for illustrative purposes only; any wavelength can be selected for the guide wavelength, as long as the constraints discussed above are followed when selecting the guide wavelength, that is the guide wavelength is within the wavelength range determined for the optical components but is distinct from the operating wavelength 205.

Additionally, if the laser system 115 is a high power laser system, then alignment can change with changes in operating power of the laser system 115 due to localized heating of optical components within the laser system 115 and the beam delivery system 119.

The light source 100 includes the guide laser 175 that is arranged and designed to account for all of these issues identified above. Thus, the guide laser 175 produces a guide laser beam having a guide wavelength that is distinct from the operating wavelength of the laser system 115 and is within the wavelength range of the optical components within the laser system 115 and/or the beam delivery system 119. Moreover, the guide laser beam of the guide laser 175 should have enough power to pass through the optical components that need to be aligned. It is possible that the guide laser could be operated at a greater power if the guide wavelength is farther away from the operating wavelength 205 and outside the wavelength range of the optical components, though it is not preferable to operate the guide laser in this manner because the amount of power required increases non-linearly (for example, exponentially) with the drop in efficiency that occurs as the guide wavelength is driven outside the wavelength range of the optical components.

As shown in FIG. 1, and as discussed in greater detail below with respect to FIGS. 5-7, the guide laser 175 can be used in a first implementation 176 to align components within the laser system 115, for example, to align an optical amplifier with another optical amplifier of the laser system 115. In this implementation 176, the guide laser 175 can be used to align the components during initial set up of the light source 100 and prior to EUV production in the chamber 130. EUV production in the chamber 130 requires not only that an amplified light beam 110 be produced, but also that the amplified light beam 110 be directed to the target location 105 and impinge upon the target material to convert the target material into plasma that emits within the EUV range. Additionally, in this implementation 176, the guide laser 175 can also be used to align components within the beam delivery system 119 to steer the amplified light beam 110 through the beam delivery system 119 and to the target location 105. Therefore, in this implementation 176, the guide laser 175 can be used to align the components and the amplified light beam 110 while the gain media of the laser system 115 is inverted but is not producing coherent laser oscillation (in the case in which there is no laser cavity) or during EUV production in the chamber 130 (in which case, there is a laser cavity, and the laser system is producing coherent laser oscillation). Alignment occurs while the gain media are inverted to compensate for lensing that can occur within the inverted gain media that would not otherwise appear in the un-inverted gain media.

As also shown in FIG. 1, and as discussed in greater detail below with respect to FIG. 8, the guide laser 175 can be used in a second implementation 177 to align the optical components within the beam delivery system 119 and to steer the amplified light beam 110 toward the target location 105. In this implementation 177, the guide laser 175 can be used to align the optical components and the amplified light beam 110 while the gain media of the laser system 115 is inverted but not during production of coherent laser oscillation or during EUV production in the chamber 130 in which case, there is a laser cavity and the laser system is producing coherent laser oscillation.

Referring to FIG. 5, the guide laser 175 is used in the first implementation 176 to align optical components of a laser system 515 during set up and prior to EUV production at the target location 105 or to align optical components of the laser system 515 and the beam delivery system 119 and to steer the amplified light beam 110 to the target location 105 during EUV production at the target location 105.

The laser system 515 is designed with one or more optical amplifiers 500, 505, and 510, each optical amplifier has a gain media capable of optically amplifying the desired wavelength (the operating wavelength) $\lambda_O$, for example, at a high gain. In particular, each of the optical amplifiers 500, 505, 510 can be a chamber arranged in series with the other chamber, with each chamber having its own gain media, excitation source, for example, electrodes, and optical components such as mirrors and lenses and windows. For example, the optical amplifiers 500, 505, 510 can include as a gain medium a filling gas that includes $CO_2$ and can amplify light at a wavelength between about 9100 and about 11000 nm, and, in particular, at about 10600 nm, at a gain greater than or equal to 1000. The $CO_2$ optical amplifiers 500, 505, 510 may also include a cooling system such as water at higher powers. Although three optical amplifiers 500, 505, 510 are shown, it is possible that as few as one amplifier and more than three amplifiers could be used in this implementation. In some implementations, each of the $CO_2$ optical amplifiers can be an RF pumped axial flow $CO_2$ laser cube having a 10 meter amplifier length that is folded by eight mirrors.

The laser system 515 can include one or more optical connection systems 520 and 525 placed, respectively, between adjacent optical amplifiers 500 and 505 and 505 and 510 to guide and direct the amplified light from each optical amplifier to the next optical amplifier. The beam delivery system 119 steers the amplified light beam 110 to the target location, at which a target material 540 is placed (at least for some period of time).

Each of the optical amplifiers 500, 505, and 510 can be designed without laser cavity (resonator) mirrors, so that when set up alone, they do not include the optical components needed to pass the amplified light beam through the gain medium more than once. Nevertheless, as mentioned above, a laser cavity can be formed as follows. If a droplet of the target material 540 is placed at the target position (as shown in FIG. 5, which omits details of the beam delivery system 119 and the chamber 130 for clarity), then spontaneously emitted photons from the optical amplifiers 500, 505, and 510 directed along the amplified light beam 110 to the target location 105 can be scattered by the target material 540 and some scattered photons can be placed on a path 545 where they travel back through the optical amplifiers 500, 505, and 510. The laser system 515 can include an optic 535 positioned to receive photons on the path 545 from the optical amplifiers 500, 505, and 510 and to direct the photons back through the optical amplifiers 500, 505, and 510 for subsequent interaction with the target material 540 to produce EUV light emitting plasma. The optic 535 can be, for example, a flat mirror, a curved mirror, a phase-conjugate mirror, or a corner reflector having a reflectivity of about 95% for wavelengths of about 10600 nm.

Thus, the guide laser 175 can be used in the first implementation 176 to align optical components of a laser system 515, for example, during set up and prior to EUV production at the target location 105. The guide laser 175 can be coupled into the laser system 515 by sending a guide laser beam 550 through a back side of the optic 535 and then through the optical amplifier 500, as shown in FIG. 5. It should be noted that the optic 535 may have a lower reflectivity at its front face for light at the guide wavelength so that it may be more transmissive at the guide wavelength and therefore it is practical to direct the guide laser beam 550 through the optic 535 in this matter. Alternatively, during alignment, the optic 535 can be removed from the laser system 515 and the guide laser beam 550 can be coupled into the laser system 515 by sending the guide laser beam 550 directly through the optical amplifier 500. In this case, the laser system 515 would not produce a coherent laser beam as the amplified light beam 110.

In either case, the guide laser beam 550 is directed toward the optical amplifier 500, and each amplifier 505, 510 is aligned with the optical amplifier 500. Any suitable alignment technique can be used. For example, the technician can move the optical connection systems 520 and 525 until the technician observes or detects the guide laser beam 550 from the guide laser 175 at the output of the optical amplifier 505. This can be done for each component in the chain from the optic 535 through the beam delivery system 119.

As also mentioned above, the guide laser 175 can be used in the first implementation 176 to align optical components of the beam delivery system 119 and to steer the amplified light beam 110 through the beam delivery system 119 to the target location 105, for example, during EUV production at the target location 105. In this case, the guide laser beam 550 can be coupled into the laser system 515 by sending it through the back side of the optic 535, then through the optical amplifier chain 500, 505, 510, as shown in FIG. 5. At this point, because the components of the laser system 515 have already been aligned during set up, the guide laser beam 550 output from the optical amplifier 510 can now be used to align the components within the beam delivery system 119. Moreover, during EUV production, the guide laser 175 can be used to steer and focus the amplified light beam 110 to the target location 105.

The guide laser 175 has enough power and its wavelength is selected using the criteria discussed above so that the guide laser beam 550 can propagate through the entire optical path from the optic 535 to the target location 105 with sufficient power to allow detection, and is nevertheless sensitive to disturbances that can occur along the path to the amplified light beam 110, and such sensitivity assists with alignment.

Referring also to FIG. 6, details of a beam transport system 620 and a focus assembly 622 that can be implemented in the beam delivery system 119 of FIG. 5 are shown. The conical shroud 150 is positioned in the chamber 130 to separate the chamber 130 into two compartments 600 and 605, while still maintaining fluid communication between the compartments 600 and 605. The compartment 600 is the compartment that houses the focus assembly 622. A laser input window 610 seals the chamber 130 while allowing the amplified light beam 110 to enter the compartment 600. The laser input window 610 can be positioned such that it is not in a direct "line of sight" with the target location 105 where plasma generated debris can originate and such that it is far enough away from the target location 105 to reduce exposure to higher temperatures near the target location 105.

The focus assembly 622 can include a focus and steering assembly 625 disposed in the compartment 600. The focus and steering assembly 625 includes a focusing optic that may include one or more mirrors, prisms, lenses, for example, arranged to focus an amplified light beam to a focal spot (for example, to focus the amplified light beam 110 to the target location 105). In this implementation, the focusing optic of the focus and steering assembly 625 includes a mirror 630 that can be an off-axis parabolic mirror that is used to focus the amplified light beam 110 to a focal spot at the target location 105. The focus and steering assembly 625 also includes a steering optic that can include one or more mirrors, prisms, lenses, for example, arranged to steer the focal spot established by the focusing optic to a desired location (for example, the target location 105) in the chamber 130. The steering optic can include a flat mirror 635 mounted on a tip-tilt actuator 640 that can move the mirror 635 independently in two dimensions. In addition to the two-dimensional movement of the focal spot afforded by the tip-tile actuator 640, movement of the focal spot in the direction of arrow 645 can be obtained by selected movement of the focus and steering assembly 625 parallel to the direction indicated by arrow 645.

Additionally, the beam transport system 620 can include one or more mirrors, prisms, or lenses, for example, arranged to adjust focal power of the amplified light beam 110. For example, the beam transport system 620 can include two spherical mirrors 650 and 655 in an optical arrangement commonly known as a z-fold telescope. One or both of the mirrors 650, 655 can be selectively moved parallel to respective direction arrows 660, 665 to adjust the focal power. The beam transport system 620 can also include a turning mirror 670 that directs the amplified light beam 110 from the z-fold telescope arrangement into the focus assembly 622. The focus assembly 622 also includes a turning mirror 675 that receives the amplified light beam from the turning mirror 670 and directs the amplified light beam to the focusing optic (mirror 630).

In this design, because the guide laser beam 550 from the guide laser 175 has already been used to align the components within the laser system 515, the guide laser 175 (in particular, the guide laser beam 550) can now be used to align the beam delivery system 119 with the laser system 515, and align the various components within the beam delivery system 119 with each other to steer the amplified light beam 110 to the target location 105.

Once these components are aligned, the guide laser beam 550 can be used to steer the amplified light beam 110 through the beam delivery system 119 and to the target location 105, for example, during EUV production. As mentioned above, the guide wavelength is chosen so that it is spatially removed from the operating wavelength 205 to enable separation between the guide laser beam 550 and the amplified light beam 110 for diagnostic purposes.

It is also possible to separate the guide laser beam 550 from the amplified light beam 110 using a temporal separation by, for example, synchronizing the guide laser beam 550 with the time between deliveries of the target material to the target location 105. As discussed above, the laser system 515 can operate in a pulsed mode so that the laser system 515 produces pulses of the amplified light beam 110 for short and repeated durations. Thus, the diagnostic measurements can be taken while the laser system 515 is not producing a pulse so that only the guide laser beam 550 from the guide laser 175 is reaching the target location 105 at these moments. One way to synchronize the guide laser beam 550 is to insert a chopper wheel into the path of the guide laser beam 550 such that the chopper wheel allows the guide laser beam 550 to pass through and to the target location 105 during the time between deliveries of the target material to the target location 105 but blocks the guide laser beam 550 during the deliveries of the target material to the target location 105. Or, the guide laser 175 could be configured to produce pulses between pulses of the laser system 515. In either way, the diagnostic measurements would be taken while the laser system 515 is not producing a pulse.

In other implementations, the guide laser beam 550 can be separated from the amplified light beam 110 with a dichroic optical device such as a dichroic filter or mirror that passes one of the guide laser beam 550 or the light beam 110 while reflecting the other of the guide laser beam 550 or the light beam 110. Such a system is described in U.S. application Ser. No. 12/637,961, entitled "Metrology for Extreme Ultraviolet Light Source", filed on Dec. 15, 2009, and assigned docket number 002-017001/2009-0027-01.

The guide laser beam 550 could be used to perform other diagnostic tests at the target location 105 during the deliveries of the target material to the target location 105 (and therefore, during EUV production). The guide laser beam 550 is constantly sampled during the EUV production and between the EUV productions. The information derived from this sampling can be used, for example, to finely tune components within the focus assembly 622 such as the beam focusing optic mirror 630 to provide the best spot quality at the target location 105.

Figure 7:
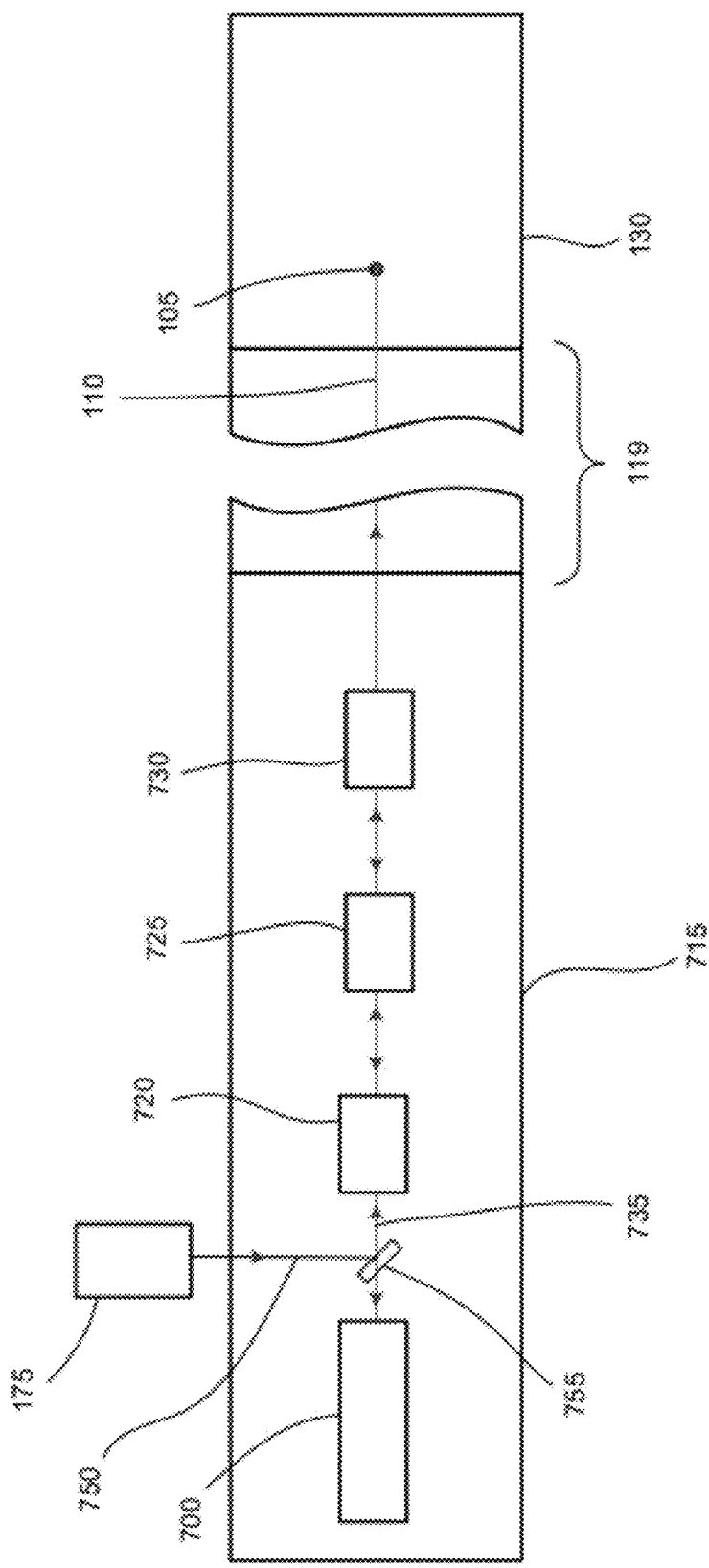
FIG. 7 is a diagram of another implementation of a laser system, a guide laser, a beam delivery system, and a target chamber of the light source of FIG. 1.

Referring to FIG. 7, in another implementation, the laser system 715 can be an axial-flow RF-pumped $CO_2$ laser system having a master oscillator (MO) 700 and one or more power amplifiers 720, 725, 730 (called PAs); such a configuration is called a MOPA configuration.

The MO 700 provides a seed light beam 735 to the PA 720. The master oscillator 700 enables fine tuning of parameters such as the center wavelength and the bandwidth. The master oscillator 700 can be a Q-switched MO that has a relatively low output energy and a high repetition rate, for example, capable of about 100 kHz operation. From the MO 700, the seed light beam 735 can be amplified by the chain of PAs 720, 725, and 730, and then shaped and focused by the beam delivery system 119 before reaching the target location 105. For example, a suitable $CO_2$ laser device having a master oscillator and three power amplifiers (a MO-PA1-PA2-PA3 configuration) is disclosed in U.S. application Ser. No. 11/174,299, entitled LPP EUV Light Source Drive Laser System and filed on Jun. 29, 2005, the entire contents of which are hereby incorporated by reference herein.

Alternatively, the laser system 115 can be configured as a so-called "self-targeting" laser system in which the target material serves as one mirror of the optical cavity. In some "self-targeting" arrangements, a master oscillator may not be required. Self-targeting laser systems are disclosed and claimed in U.S. application Ser. No. 11/580,414 entitled Drive Laser Delivery Systems for EUV Light Source and filed on Oct. 13, 2006, the entire contents of which are hereby incorporated by reference herein.

The beam delivery system 119 modifies the amplified light beam as needed to couple into the chamber 130. As discussed above, the beam delivery system 119 can include one or more mirrors, prisms, lenses, for example, arranged to adjust focal power of the amplified light beam prior to output to the chamber 130. The mirrors, prisms, lenses can be used to turn or direct the amplified light beam from the laser system 715 into the chamber 130. An example of a beam delivery system is described in U.S. Publication No. 2006/0219957.

As mentioned above, the guide laser 175 can be used in the first implementation 176 to align optical components of a laser system 715, for example, during set up and prior to EUV production at the target location 105. The guide laser beam 750 (from the guide laser 175) can be coupled into the laser system 715 by sending it through a beam splitter 755 at an output of the master oscillator 700, as shown in FIG. 7. In this way, the guide laser beam 750 is reflected at the beam splitter 755, but the output beam from the master oscillator 700 passes through the beam splitter 755 so that both the guide laser beam 750 and the master oscillator output beam impinge upon the PA 720. The guide laser beam 750 can therefore be used to align each of the PAs 720, 725, 730 relative to each other and to the MO 700, and to align components within the beam delivery system 119.

As also mentioned above, the guide laser 175 can additionally or alternatively be used in the first implementation 176 to align optical components of the beam delivery system 119 and to steer the amplified light beam 110 through the beam delivery system 119 to the target location 105, for example, during EUV production at the target location 105. In this case, the guide laser beam 750 can be coupled into the laser system 715 by sending it through the beam splitter 755, as shown in FIG. 7. The guide laser beam 750 has enough power and its wavelength is selected using the criteria discussed above so that the guide laser beam 750 can propagate through the entire optical path from the beam splitter 750 to the target location 105 and is nevertheless sensitive to disturbances that can occur along the path to the amplified light beam 110, where such sensitivity assists in alignment.

Figure 8:
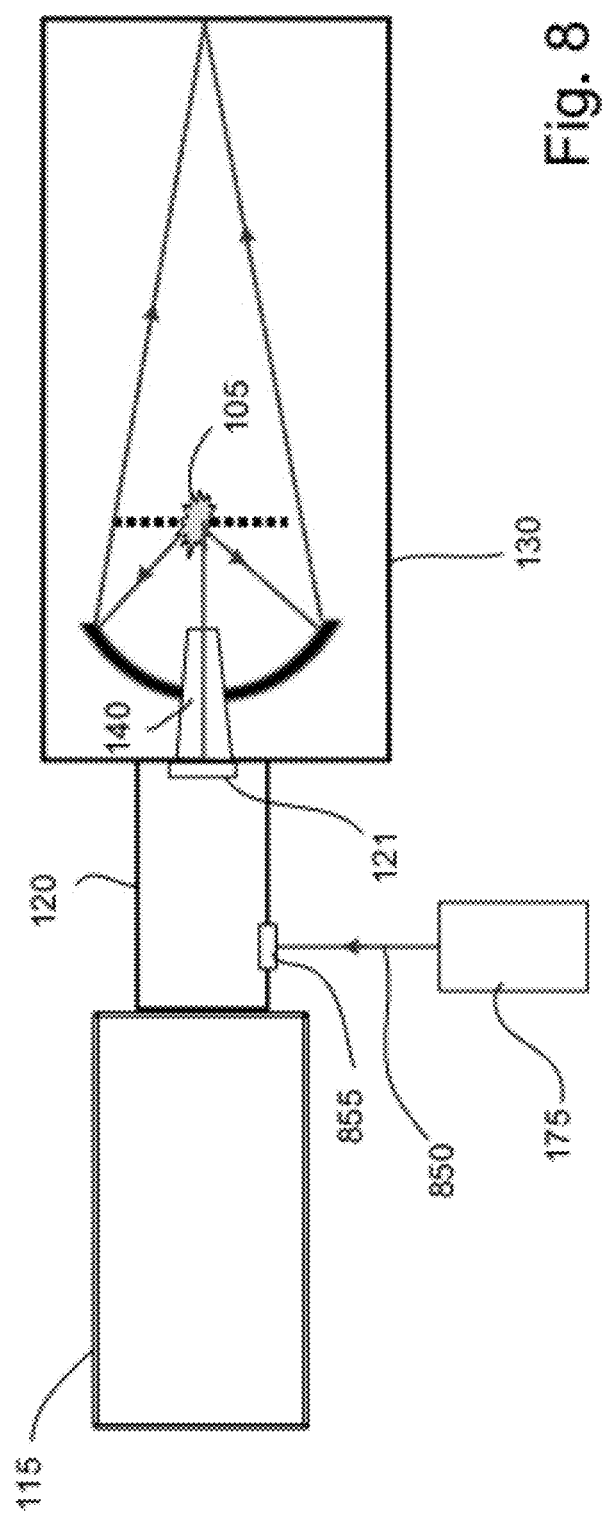
FIG. 8 is a diagram of a portion of a laser system, a guide laser, a beam delivery system, and a target chamber that can be used in the light source of FIG. 1.

Referring to FIG. 8, the guide laser 175 is used in the second implementation 177 to align optical components of the beam delivery system 120 and to steer the amplified light beam 110 to the target location 105 during EUV production at the target location 105. In the second implementation 177, the guide laser 175 would not be used to align components within the laser system 115 so the second implementation 177 could be used only during EUV production and after initial set up. The guide laser beam 850 output from the guide laser 175 can be coupled into the beam delivery system 119 through a window 855 that seals the chamber 130 while allowing the guide laser beam 850 to enter the beam delivery system 119. As discussed above, the chamber 130 includes two compartments where one compartment includes at least a portion of the beam delivery system 119 and the other compartment includes the target location 105.

A guide laser 175 can be selected that meets the criteria discussed above for a laser system 115 that includes as a gain medium in the optical amplifiers a filling gas that includes $CO_2$ and can amplify light at a wavelength between about 9100 and about 11000 nm, and, in particular, at about 10600 nm. In a first implementation, the guide laser 175 is a broadly tunable mid-IR external cavity laser based on quantum cascade technology. Such a laser could be tuned to a wavelength of about 8100 nm, for example, which is close enough to the operating wavelength of the $CO_2$ amplifiers and is within the wavelength range of the optical components that could be used in a setup for the $CO_2$ amplifiers. Such a quantum cascade laser can be purchased from Daylight Solutions of Poway, Calif. In a second implementation, the guide laser 175 is a tunable $CO_2$ laser that can be grating tuned or gratingless tuned, with a range of selectable wavelengths that can be distinct from the $CO_2$ optical amplifiers used in the laser system 115 be selecting special optics in the cavity and/or $CO_2$ isotope gas fills. Such a laser can be purchased from Access Laser Company of Marysville, Wash. For example, if the guide laser 175 is a $CO_2$ laser that uses a $CO_2$ isotope as the gain medium, the guide wavelength can be selected to be about 11000 nm, or any wavelength between 9000 and 11000 nm.

Other implementations are within the scope of the following claims. With reference to FIG. 1, other types of laser systems 115 can be suitable, such as, for example, a solid state laser, a two chamber, oscillator-amplifier system (also referred to as a MOPA or MOPRA), as shown in U.S. Pat. Nos. 6,625,191, 6,549,551, and 6,567,450, which are incorporated herein by reference in their entirety, an excimer laser having a single chamber, an excimer laser having two or more chambers, for example, an oscillator chamber and one or more amplifying chambers (with the amplifying chambers in parallel or in series), a master oscillator/power oscillator (MOPO) arrangement, a power oscillator/power amplifier (POPA) arrangement, or a solid state laser that seeds one or more excimer or molecular fluorine amplifier or oscillator chambers.

Although the detector 165 is shown in FIG. 1 positioned to receive light directly from the target location 105, the detector 165 could alternatively be positioned to sample light at or downstream of the intermediate focus 145 or some other location.

In general, irradiation of the target material can also generate debris at the target location 105, and such debris can contaminate the surfaces of optical elements including but not limited to the collection mirror 135. Therefore, a source of gaseous etchant capable of reaction with constituents of the target material can be introduced into the chamber 130 to clean contaminants that have deposited on surfaces of optical elements, as described in U.S. Pat. No. 7,491,954, which is incorporated herein by reference in its entirety. For example, in one application, the target material can include Sn and the etchant can be HBr, Br2, $Cl_2$, HCl, H2, HCF3, or some combination of these compounds.

The light source 100 can also include one or more heaters 170 that initiate and/or increase a rate of a chemical reaction between the deposited target material and the etchant on a surface of an optical element. For example, for a target material including Sn used together with an HBr etchant, the heater 170 can heat the contaminated surface of an optical element, for example, a laser input window that is at the interface between the operating laser system 115 and the beam delivery system 119 to a temperature in the range of 150 to 400° C., and for some applications, greater than 400° C. For a plasma target material that includes Li, the heater 170 can be designed to heat the surface of one or more optical elements to a temperature in the range of about 400 to 550° C. to vaporize Li from the surface, that is, without necessarily using an etchant. Types of heaters that can be suitable include radiative heaters, microwave heaters, RF heaters, ohmic heaters, or combinations of these heaters. The heater can be directed to a specific optical element surface, and thus be directional, or it can be non-directional and heat the entire chamber 130 or substantial portions of the chamber 130.

For example, the beam delivery system 119 need not be in fluid communication with the chamber 130; rather, the beam delivery system 119 could be designed as a separate chamber.

Figure 9:
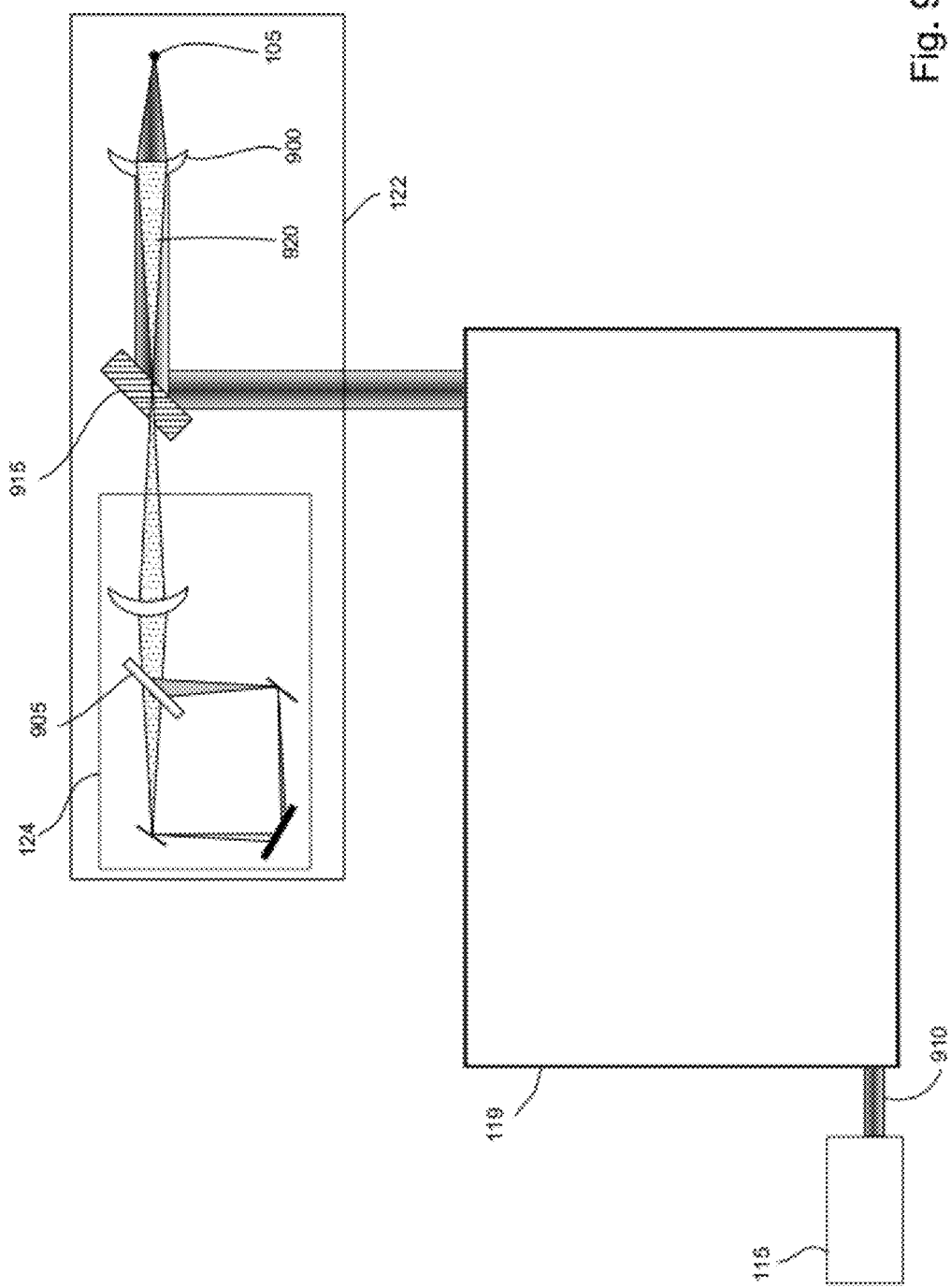
FIG. 9 is a block diagram of an exemplary beam delivery system positioned between a laser system and a target location of the light source of FIG. 1.

Referring to FIG. 9, in other implementations, the focus assembly 122 includes a refractive focusing element 900 and the metrology system 124 includes an dichroic mirror 905, as described in U.S. application Ser. No. 12/638,092, entitled "Beam Transport System for Extreme Ultraviolet Light Source," filed on Dec. 15, 2009, and assigned docket number 002-018001/2009-0029-01, which is incorporated herein by reference in its entirety. The beam delivery system 119 is positioned between the laser system 115 and a target location 105, the beam delivery system 119 including the beam transport system 120 and the focus assembly 122. The beam transport system 120 receives an amplified light beam 910 produced by the laser system 115, redirects and expands the amplified light beam 910, and then directs the expanded, redirected amplified light beam 910 toward the focus assembly 122. The focus assembly 122 focuses the amplified light beam 910 to the target location 105.

The beam transport system 120 includes a set of optical components such as mirrors (which are sometimes referred to as fold mirrors) that change the direction of the amplified light beam 910. The fold mirrors can be made of any substrates and coatings that are suitable for reflecting the amplified light beam 910.

The focus assembly 122 includes a final fold mirror 915 and the refractive focusing element 900 that is a converging lens configured and arranged to focus the amplified light beam 910 reflected from the mirror 915 to the target location 105. The refractive focusing element 900 is made of a material that can transmit at the wavelength of the amplified light beam 910. In some implementations, the refractive focusing element 900 is made of ZnSe.

The focus assembly 122 can also include the metrology system 124 that captures light 920 reflected from the refractive focusing element 900. This captured light can be used to analyze properties of the amplified light beam 910 and light from the guide laser 175, for example, to determine a position of the amplified light beam 910 and monitor changes in a focal length of the amplified light beam 910. Specifically, the captured light can be used to provide information regarding the position of the amplified light beam 910 on the refractive focusing element 900, and to monitor focal length changes of the refractive focusing element 900 due to changes in temperature (for example heating) of the refractive focusing element 900.

The refractive focusing element 900 can be a meniscus lens to enable or facilitate focusing of the amplified light beam 910 reflected from the mirror 915 to the desired position of the target location 105. Additionally, the refractive focusing element 900 can include an aspheric correction on each of its surfaces to simultaneously provide a tightly focused transmitted amplified light beam 910 and a tightly focused light 920 that is reflected from the refractive focusing element 900. The refractive focusing element 900 can be designed with at least one surface that is an on-axis segment of a paraboloid.

The refractive focusing element 900 can be made of ZnSe, which is a material that can be used for infrared applications. ZnSe has a transmission range covering 0.6 to 20 µm and can be used for high power light beams that are produced from high power amplifiers. ZnSe has a low thermal absorption in the red (specifically, the infrared) end of the electromagnetic spectrum. Other materials that can be used for the refractive focusing element 900 include, but aren't limited to: gallium arsenide (GaAs), germanium, silicon, amorphous material transmitting infrared radiation (AMTIR), and diamond.

At least some of the fold mirrors in the beam transport system 120 and the mirror 915 can be movable with the use of a movable mount that is actuated by a motor that can be controlled by the master controller 155 to provide active pointing control of the amplified light beam 910 to the target location 105. The movable fold mirrors can be adjusted to maintain the position of the amplified light beam 910 on the refractive focusing element 900 and the focus of the amplified light beam 910 at the target material.

The dichroic mirror 905 is configured to separate the diagnostic portions of the light 920 by transmitting substantially all of one of the portions and reflecting substantially all of the other of the portions based on the wavelengths of each of the portions. In the implementations discussed below, the dichroic mirror 905 transmits substantially all (that is, greater than about 99%) of the guild laser beam and reflects substantially all (that is, greater than about 99%) of the amplified light beam. However, it should be noted that that dichroic mirror 905 can be configured to transmit substantially (that is, greater than 99%) the entire amplified light beam and reflect substantially (that is, greater than 99%) the entire guide laser beam.

What is claimed is:

1. A method comprising:
supplying pump energy to a gain medium of at least one optical amplifier of a gas laser system to cause a population inversion in the gain medium and to produce an amplified light beam, wherein the at least one optical amplifier operates at an operating wavelength;
directing the amplified light beam toward one or more optical components associated with the gas laser system, wherein each optical component at which the amplified light beam is directed is associated with a wavelength range that encompasses the operating wavelength of the at least one optical amplifier;
directing a guide laser beam from a guide laser having a guide wavelength toward the optical components, so that the guide laser beam traces the path of the amplified light beam toward the optical components; and
aligning the optical components using the directed guide laser beam;
wherein the guide wavelength is distinct from the operating wavelength and is within the wavelength range of each of the optical components at which the amplified light beam is directed.

2. The method of claim 1, wherein the guide wavelength is distinct from the operating wavelength such that the guide laser beam does not contribute substantially to the gain of the gas laser system.

3. The method of claim 1, wherein one or more of the optical components are within the gas laser system.

4. The method of claim 3, wherein directing the guide laser beam toward the optical components includes directing the guide laser beam through the gas laser system.

5. The method of claim 3, further comprising arranging an optical reflector at a back side of the gas laser system such that the amplified light beam that exits the gas laser system is reflected off the optical reflector back into the gas laser system through the back side;
wherein directing the guide laser beam toward the optical components includes directing the guide laser beam through the optical reflector.

6. The method of claim 1, further comprising amplifying the amplified light beam to a point at which it becomes an operating laser beam.

7. The method of claim 6, wherein one or more of the optical components are between the gas laser system and a target location at which the operating laser beam is directed.

8. The method of claim 7, further comprising aligning the operating laser beam onto the target location using the guide laser beam.

9. The method of claim 7, wherein aligning the operating laser beam includes directing the guide laser beam toward the target location through the one or more optical components.

10. The method of claim 9, further comprising supplying a target material at the target location for a target time period; wherein directing the guide laser beam toward the target location includes directing the guide laser beam toward the target location for a time outside of the target time period.

11. The method of claim 6, further comprising supplying a target material at the target location; wherein directing the operating laser beam toward the target location causes production of plasma at the target material.

12. The method of claim 1, wherein aligning the optical components using the amplified light beam includes aligning the optical components during initial set up of the gas laser system.

13. A method comprising:
supplying pump energy to a gain medium of at least one optical amplifier of a gas laser system to cause a population inversion in the gain medium and to produce an amplified light beam, wherein the at least one optical amplifier operates at an operating wavelength;
directing a guide laser beam from a guide laser having a guide wavelength toward optical components, wherein each optical component is associated with a range of wavelengths; and aligning the optical components using the directed guide laser beam;
wherein the guide wavelength is distinct from the operating wavelength and is within the wavelength range of the optical components, and wherein aligning the optical components using the amplified light beam includes aligning the optical components during laser operation of the gas laser system.

14. A system for aligning optical components, the system comprising:
a gas laser system having one or more optical amplifiers that each operate at an operating wavelength and each include a gain medium that, when in a pumped state, produces an amplified light beam;
optical components, each associated with a range of wavelengths that encompasses the operating wavelength of the one or more optical amplifiers; and
a guide laser that produces a guide laser beam having a guide wavelength, wherein the guide laser is positioned such that the guide laser beam is directed toward the optical components while a gain medium of the one or more optical amplifiers of the gas laser system is in a pumped state so that the guide laser beam traces the path of the amplified light beam toward the optical components;
wherein the guide wavelength is distinct from the operating wavelength and is within the wavelength range of each of the optical components at which the amplified light bean is directed.

15. The system of claim 14, wherein the wavelength range of each of the optical components encompasses the operating wavelength of the gas laser system.

16. The system of claim 14, wherein the guide wavelength is distinct from the operating wavelength such that the guide laser beam does not contribute substantially to gain of the gas laser system.

17. The system of claim 14, wherein the gas laser system lacks a master oscillator.

18. The system of claim 14, wherein the one or more optical amplifiers of the gas laser system include $CO_2$ as the gain media.

19. The system of claim 14, wherein the optical components are within one or more of the optical amplifiers.

20. The system of claim 14, wherein the optical components are external to the one or more optical amplifiers.

21. The system of claim 14, wherein the one or more optical amplifiers are arranged in series and include cavity forming mirrors, one of the cavity forming mirrors including a highly reflecting mirror and the other of the cavity forming mirrors including an output coupler.

22. A system for aligning optical components, the system comprising:
a gas laser system having one or more optical amplifiers that each operate at an operating wavelength and each include a gain medium that, when in a pumped state, produces an amplified light beam;
optical components, each associated with a range of wavelengths;
a guide laser that produces a guide laser beam having a guide wavelength, wherein the guide laser is positioned such that the guide laser beam is directed toward the optical components while a gain medium of the one or more optical amplifiers of the gas laser system is in a pumped state;
an output coupler at a front side of the gas laser system; and
an optical reflector at a back side of the gas laser system that is distinct from the front side, wherein the optical reflector is positioned so that an amplified light beam that exits the gas laser system is reflected from a front face of the optical reflector and is directed back into the gas laser system through the back side;
wherein the guide wavelength is distinct from the operating wavelength and is within the wavelength range of the optical components.

23. The system of claim 22, wherein the guide laser beam is directed through a back face of the optical reflector toward the optical components.

24. A system for aligning optical components, the system comprising:
a gas laser system having one or more optical amplifiers that each operate at an operating wavelength and each include a gain medium that, when in a pumped state, produces an amplified light beam;
optical components, each associated with a range of wavelengths; and
a guide laser comprising an isotopic $CO_2$ gas laser that produces a guide laser beam having a guide wavelength, wherein the guide laser is positioned such that the guide laser beam is directed toward the optical components while a gain medium of the one or more optical amplifiers of the gas laser system is in a pumped state;
wherein the guide wavelength is distinct from the operating wavelength and is within the wavelength range of the optical components.

25. A system for aligning optical components, the system comprising:
a gas laser system having one or more optical amplifiers that each operate at an operating wavelength and each include a gain medium that, when in a pumped state, produces an amplified light beam;
optical components, each associated with a range of wavelengths; and
a guide laser comprising a quantum cascade laser operating at a wavelength of about 8100 nm, the guide laser producing a guide laser beam having a guide wavelength, wherein the guide laser is positioned such that the guide laser beam is directed toward the optical components while a gain medium of the one or more optical amplifiers of the gas laser system is in a pumped state;
wherein the guide wavelength is distinct from the operating wavelength and is within the wavelength range of the optical components.

26. A laser produced plasma system for producing extreme ultraviolet light, the system comprising:
a target material delivery system that produces a target material at a target location;
at least one optical amplifier containing a gain medium that defines an amplification band;
a set of optical components, each optical component associated with a wavelength range that encompasses the operating wavelength of the at least one optical amplifier so that the set is configured and arranged to propagate an amplified light beam produced in the gain medium through the gain medium and to deliver the amplified light beam to the target location; and
a guide laser that produces a guide laser beam that has a wavelength outside of the amplification band of the gain medium and inside the wavelength range of each of the optical components, wherein the guide laser beam is directed through the optical component set in the same way as the amplified light beam.

27. The laser system of claim 26, wherein the at least one optical amplifier has enough gain to convert the amplified light beam into an operating laser beam when the target material is at the target location.

28. The laser system of claim 26, wherein the optical component set includes a focus assembly between the at least one optical amplifier and the target location, wherein the focus assembly is configured and arranged to focus the amplified light beam onto the target location.

29. The laser system of claim 28, wherein the focus assembly includes one or more of lenses and mirrors.

30. A method for producing extreme ultraviolet light, the method comprising:
producing a target material at a target location;
supplying pump energy to a gain medium of at least one optical amplifier that has an amplification band to produce an amplified light beam;
propagating the amplified light beam through the gain medium using one or more optical components of a set of optical components, wherein each of the one or more optical components used for propagation of the amplified light beam is associated with a wavelength range that encompasses the operating wavelength of the at least one optical amplifier;
delivering the amplified light beam to the target location using the one or more optical components of the optical component set;
producing with a guide laser a guide laser beam that has a wavelength outside of the amplification band of the gain medium and inside the wavelength range of the one or more optical components; and
directing the guide laser beam through the optical component set in the same way as the amplified light beam to thereby align the one or more optical components of the optical component set.

* * * * *